US 9,260,020 B2

United States Patent
Ishii et al.

(10) Patent No.: US 9,260,020 B2
(45) Date of Patent: Feb. 16, 2016

(54) POWER CONVERTER MOUNTED ON ELECTRICALLY DRIVEN VEHICLE

(71) Applicant: NISSAN MOTOR CO., LTD., Yokohama-shi, Kanagawa (JP)

(72) Inventors: Takaya Ishii, Yokohama (JP); Nobuaki Yokoyama, Yokohama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/429,057

(22) PCT Filed: Jul. 19, 2013

(86) PCT No.: PCT/JP2013/069643
§ 371 (c)(1),
(2) Date: Mar. 18, 2015

(87) PCT Pub. No.: WO2014/045700
PCT Pub. Date: Mar. 27, 2014

(65) Prior Publication Data
US 2015/0231975 A1  Aug. 20, 2015

(30) Foreign Application Priority Data
Sep. 19, 2012  (JP) ................................ 2012-205895

(51) Int. Cl.
*B60L 11/08*  (2006.01)
*B60L 11/18*  (2006.01)

(52) U.S. Cl.
CPC ............. *B60L 11/1803* (2013.01); *B60L 11/08* (2013.01)

(58) Field of Classification Search
None
See application file for complete search history.

(56) References Cited

U.S. PATENT DOCUMENTS

| 6,091,604 A * | 7/2000 | Plougsgaard | H02M 7/003 165/185 |
| 2006/0120001 A1* | 6/2006 | Weber | H02M 7/003 361/103 |
| 2009/0096301 A1 | 4/2009 | Sumi et al. | |
| 2012/0188712 A1* | 7/2012 | Ishibashi | H02M 7/003 361/688 |

FOREIGN PATENT DOCUMENTS

| JP | 11-136960 A | 5/1999 |
| JP | 2003-299366 A | 10/2003 |
| JP | 2005-354864 A | 12/2005 |
| JP | 2008-29093 A | 2/2008 |
| JP | 2009-118725 A | 5/2009 |
| JP | 2009-295311 A | 12/2009 |

* cited by examiner

*Primary Examiner* — Jared Fureman
*Assistant Examiner* — Aqeel Bukhari
(74) *Attorney, Agent, or Firm* — Foley & Lardner LLP

(57) ABSTRACT

A power converter configured to be mounted on an electrically driven vehicle comprises a control board that controls a power module including a semiconductor device, a connector provided on the control board so as to be connected to an external controller, a strong electric component arranged so as to overlap the control board, and a housing that houses the control board and the strong electric component. A bottom portion of the housing is formed to swell in a convex-shaped manner, a part of the strong electric component is housed in an area of the housing that swells in the convex-shaped manner, and the strong electric component is formed so that a projection area thereof to the overlappingly arranged control board is smaller than a surface area of the control board. The connector is arranged in an area of the control board broader than a projection plane of the overlappingly arranged strong electric component to the control board.

4 Claims, 6 Drawing Sheets

POWER CONVERTER MOUNTED ON ELECTRICALLY DRIVEN VEHICLE

TECHNICAL FIELD

The present invention relates to a power converter configured to be mounted on an electrically driven vehicle such as an electric vehicle or a hybrid vehicle.

BACKGROUND ART

In the prior art, there was proposed a power converter configured to be mounted on an electrically driven vehicle such as an electric vehicle or a hybrid vehicle, by which excellent vehicle mount workability is obtained even when a large capacity smoothing electrolytic capacitor is provided (refer to JP 11-136960 A). This power converter comprises a power module as a three-phase inverter circuit consisting of a semiconductor device, a control board for controlling the power module, and an input current smoothing capacitor. A plurality of cylindrical electrolytic capacitors connected in parallel with each other are housed in a metal capacitor casing having a flat can shape while they are arranged side by side along a line in an extending direction of the control board. The metal capacitor casing is arranged to cover the control board. A connector for external connection of the control board is arranged on the control board covered by the capacitor.

SUMMARY OF INVENTION

However, in the power converter, since the connector for external connection of the control board is arranged on the control board covered by the capacitor, a gap between the capacitor and the control board is narrow, and workability for connection between the connector and an external connection harness is disadvantageously poor.

In view of the aforementioned problems, this invention provides a power converter configured to be mounted on an electrically driven vehicle, suitable for obtaining workability for connecting a connector between a control board and an external connection harness.

According to an aspect of the invention, there is provided a power converter comprising a control board that controls a power module including a semiconductor device, a connector provided on the control board and connected to an external controller, a strong electric component arranged so as to overlap the control board, and a housing that houses the control board and the strong electric component therein. A bottom portion of the housing is formed to swell in convex-shaped manner, and a part of the strong electric component is housed in the an area of the housing that swells in the convex-shaped manner, and the strong electric component is formed so that a projection area thereof to the overlappingly arranged control board is smaller than a surface area of the control board. The connector is arranged in an area of the control board broader than a projection plane of the overlappingly arranged strong electric component to the control board.

Hereinafter, embodiments of this invention will be described in more detail with reference to the accompanying drawings.

DESCRIPTION OF EMBODIMENTS

Figure 1:
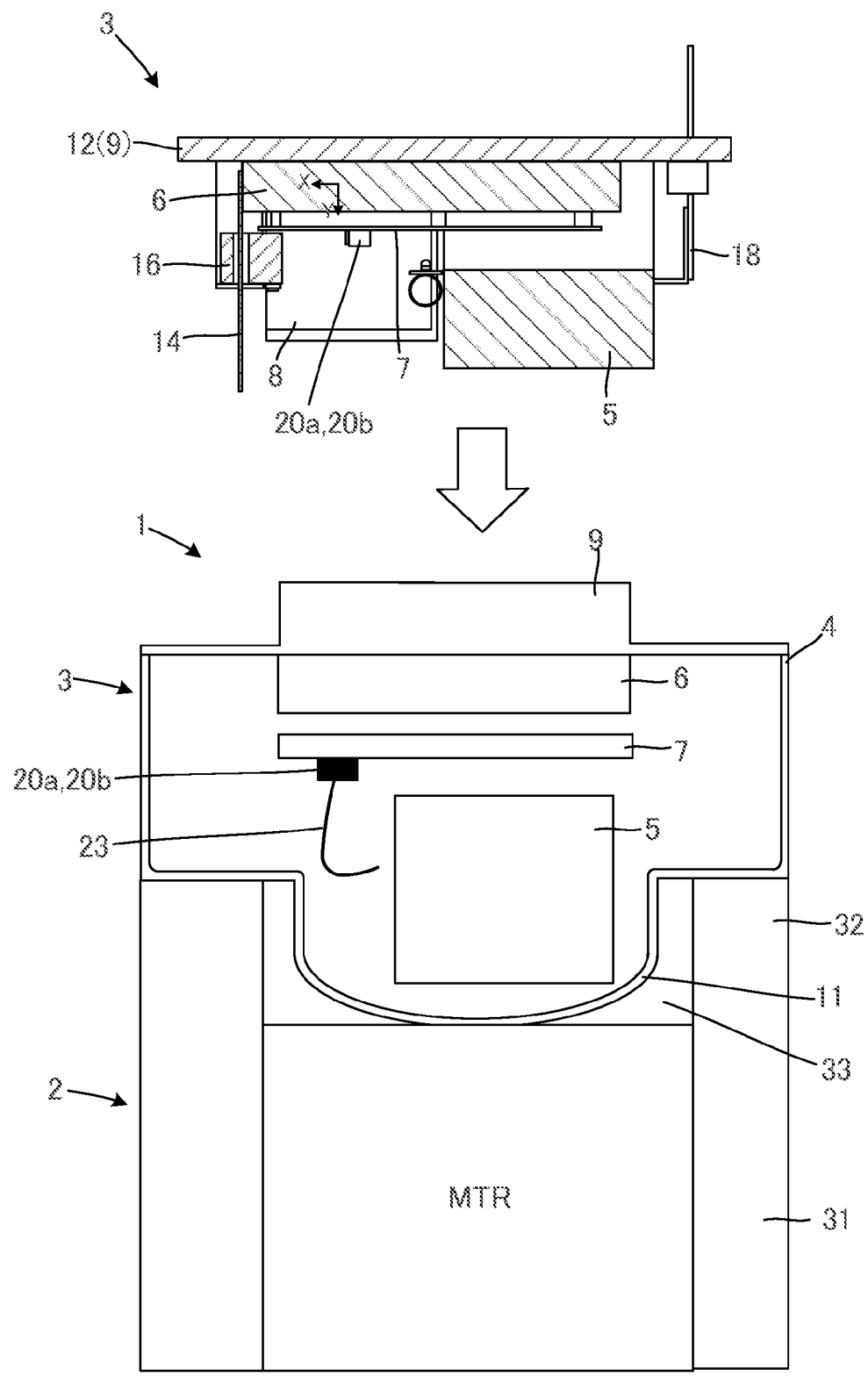
FIG. 1 is a front view illustrating a state that a power converter configured to be mounted on an electrically driven vehicle according to an embodiment of this invention is mounted on a power unit.
Figure 2:
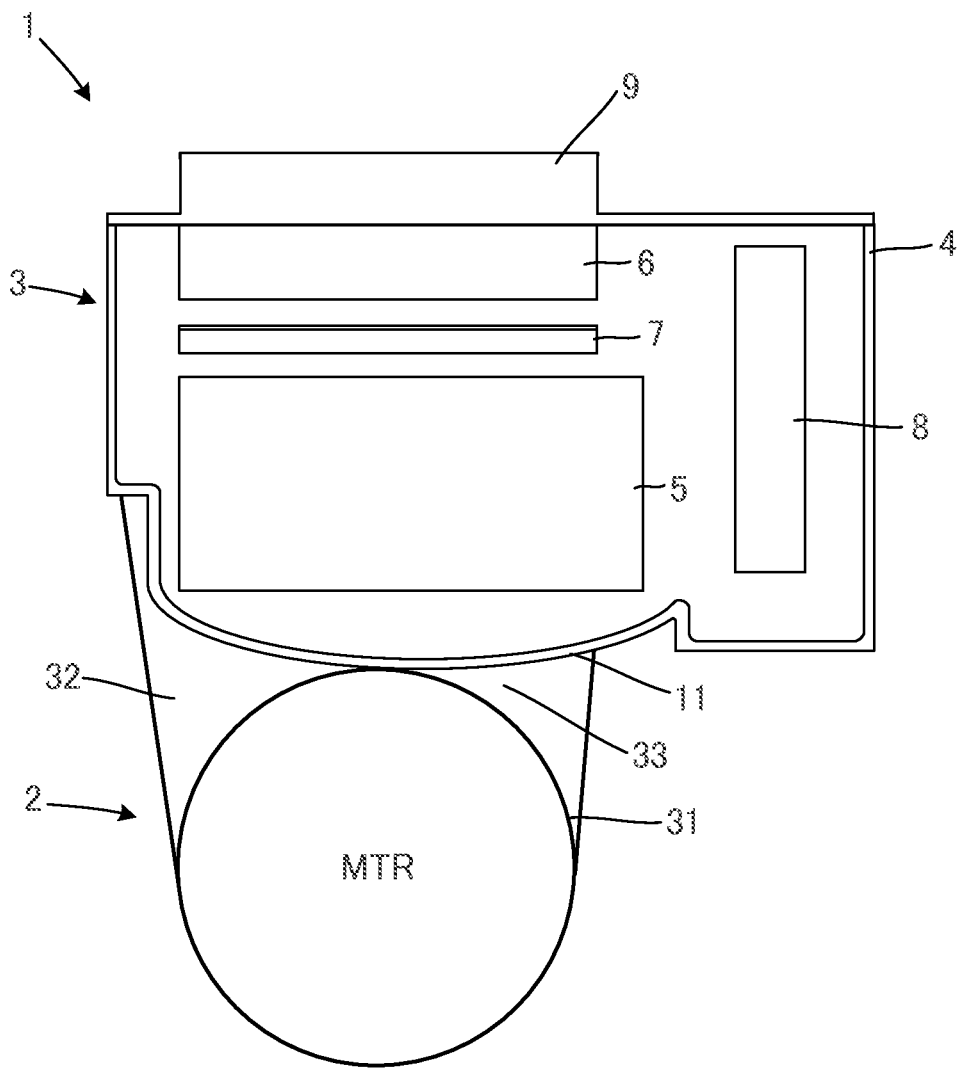
FIG. 2 is a side view illustrating a state that the power converter configured to be mounted on an electrically driven vehicle is mounted on the power unit.

Hereinafter, a power converter configured to be mounted on an electrically driven vehicle according to an embodiment of this invention will be described. FIGS. 1 and 2 are front and side views, respectively, illustrating a state that a power converter configured to be mounted on an electrically driven vehicle according to an embodiment is mounted on a power unit.

Referring to FIG. 1, a power unit 1 of an electrically driven vehicle such as an electric vehicle or a hybrid vehicle is arranged generally inside a motor room in the case of the electric vehicle or generally inside an engine room in the case of the hybrid vehicle. The power unit 1 comprises a motor/generator 2 that drives a vehicle and a power converter 3 that supplies battery power to the motor/generator 2 and charges the battery using regenerative power of the motor/generator 2. Although not illustrated in the drawings, a transaxle for transmitting power to wheels is installed in the motor/generator 2, and the power unit 1 and the transaxle integrated with each other are elastically mounted on a chassis. The motor/generator 2 is the heaviest component in the power unit 1. For this reason, the motor/generator 2 is arranged in the lower side in a vertical direction of a vehicle, and the power converter 3 is arranged thereover.

The power converter 3 is housed in a die-cast aluminum housing 4 fixedly arranged over the motor/generator 2. The power converter 3 comprises a smoothing capacitor 5 that smoothens the DC power supplied from the battery and a power module 6 having an inverter that converts the smoothened DC power into poly-phase AC power and supplies it to the motor/generator 2. That is, the inverter consists of a plurality of switching power elements (for example, insulated gate bipolar transistors (IGBT)) and is integrated as the power module 6. In addition, the power converter 3 performs power conversion for charging the battery by converting the regenerative power generated from the motor/generator 2 into DC power.

The power converter 3 comprises a control board 7 (driver circuit board) for operating the power module 6 having the inverter, a motor control board 8 for controlling the control board 7 depending on a vehicle driving condition, and a cooler 9 for cooling the power module 6. The cooler 9 is manufactured of a die-cast aluminum and internally has a space for circulating a cooling medium. Therefore, in the power converter 3 in an assembly state, the smoothing capacitor 5, the control board 7, and the power module 6 are arranged in this order from the bottom inside the housing 4 as illustrated in the drawings, the motor control board 8 is arranged in a lateral side thereof, and the cooler 9 is arranged in an opening of the housing 4.

During an assembly process of the power converter 3, the power module 6, the control board 7, and the smoothing capacitor 5 are arranged in this order on the bottom surface of the cooler 9 while the cooler 9 is flipped upside down. In addition, the motor control board 8 is arranged in the lateral side thereof, so that an integrated assembly of the power converter 3 is obtained. Furthermore, the housing 4 covers the integrated assembly of the power converter 3, and the housing 4 is fixed on the bottom surface of the cooler 9 using a bolt and the like, so that the assembly process of the power converter 3 is completed. Then, while the assembled power converter 3 is flipped upside down, the power converter 3 is fixed to a casing 31 of the motor/generator 2 using a bolt and the like, so that the assembly process of the power unit 1 is completed.

The casing 31 of the motor/generator 2 has a stator and a rotor having a ring shape to provide a cylindrical exterior shape. For this reason, upwardly protruding support convex portions 32 are provided in both ends of the axial direction of the casing 31 of the motor/generator 2 having a cylindrical shape, and the power converter 3 is installed in the support convex portions 32, so that the power converter 3 can be installed over the motor/generator 2.

An upper shape of the casing 31 of the motor/generator 2 has a convex portion on its both ends due to the support convex portions 32 and has a concave portion 33 in its center (refer to FIG. 2). If the bottom surface of the power converter 3 is a plane, a gap is generated therebetween, so that a vertical size of the power unit 1 including the power converter 3 and the motor/generator 2 increases. For this reason, according to this embodiment, the bottom shape of the housing 4 of the power converter 3 has a downwardly convex shape 11 so that a part of the housing 4 is housed in the concave portion 33 on the upper surface of the motor/generator 2. For this reason, a part of the incorporated components of the power converter 3 can be arranged in the area having the convex shape 11 in the lower side of the housing 4. Accordingly, it is possible to reduce a size of the power converter 3 over the support convex portions 32 of the motor/generator 2 by the corresponding volume.

According to this embodiment, a part of the smoothing capacitor 5 is embedded in the area corresponding to the convex shape 11 in the lower side of the housing 4. As a result, it is possible to reduce a vertical size of the power unit 1 including the power converter 3 and the motor/generator 2.

It is noted that the concave portion 33 on the upper surface of the motor/generator 2 and the convex shape 11 of the housing 4 of the power converter 3 are arranged in the center of the axial direction of the motor/generator 2 in the drawings. However, the concave portion 33 of the motor/generator 2 and the convex shape 11 of the housing 4 may be arranged to deviate from the center position of the axial direction of the motor/generator 2 toward either the left or right side.

Figure 3:
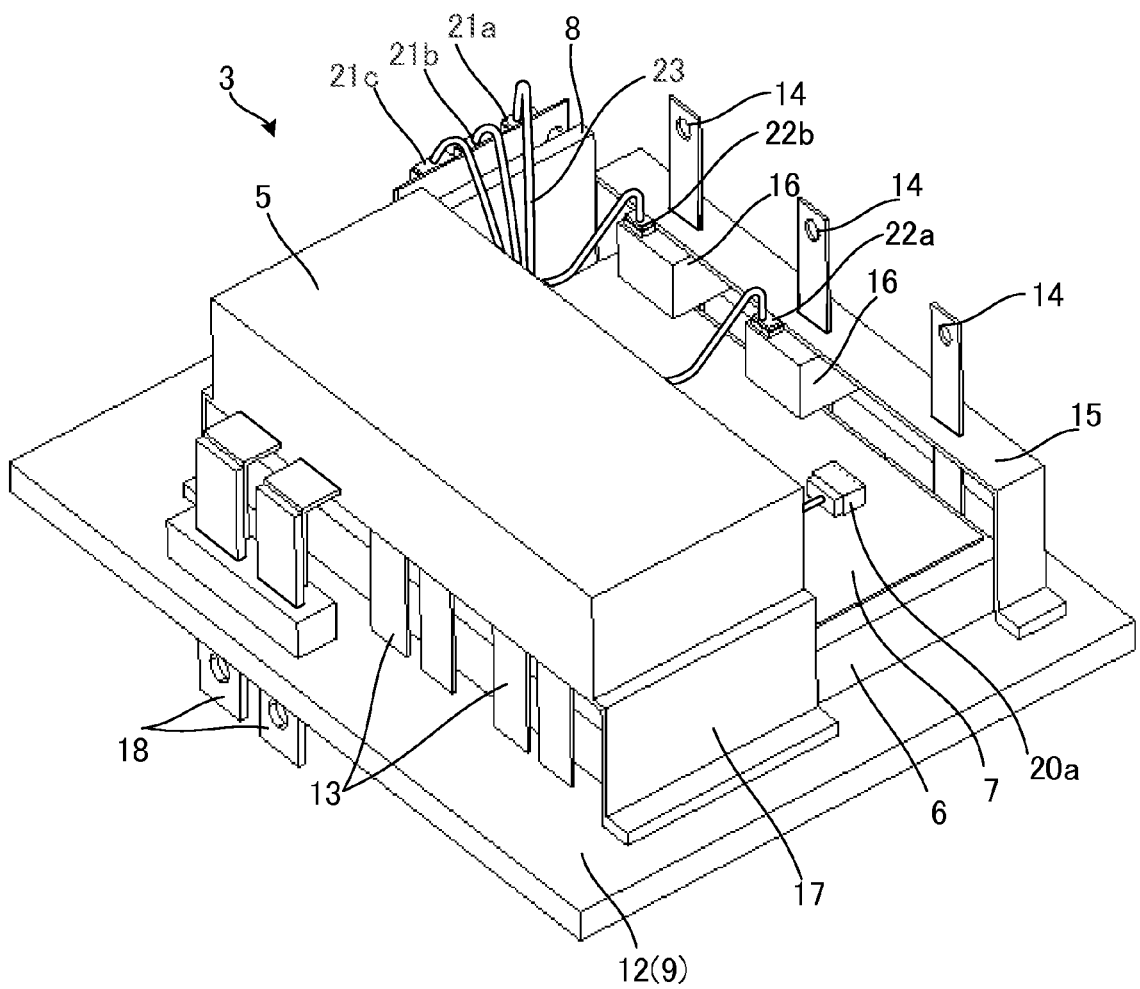
FIG. 3 is a perspective view illustrating a power converter configured to be mounted on an electrically driven vehicle.
Figure 4:
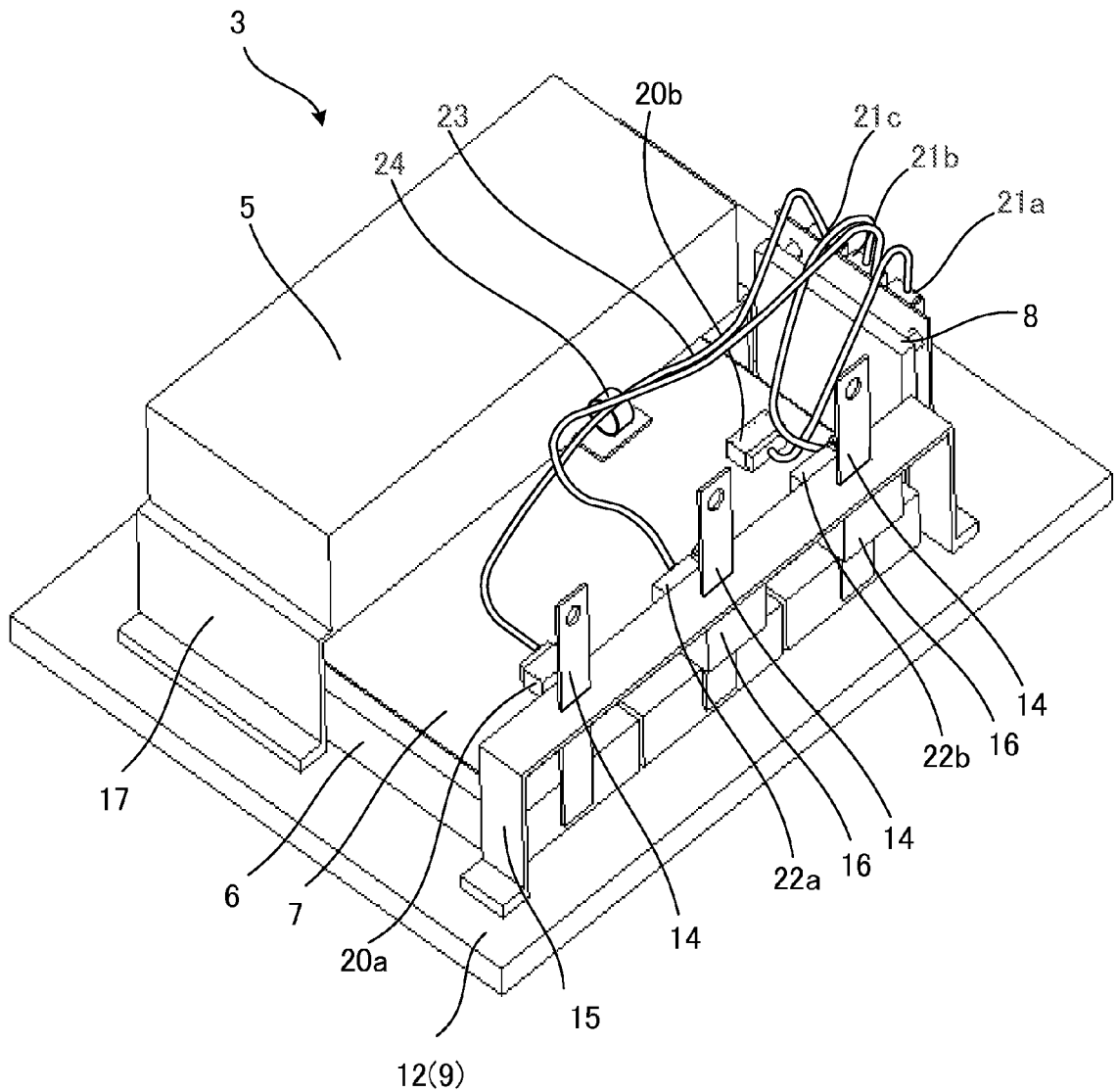
FIG. 4 is a perspective view illustrating a power converter configured to be mounted on an electrically driven vehicle as seen from a different direction.
Figure 5:
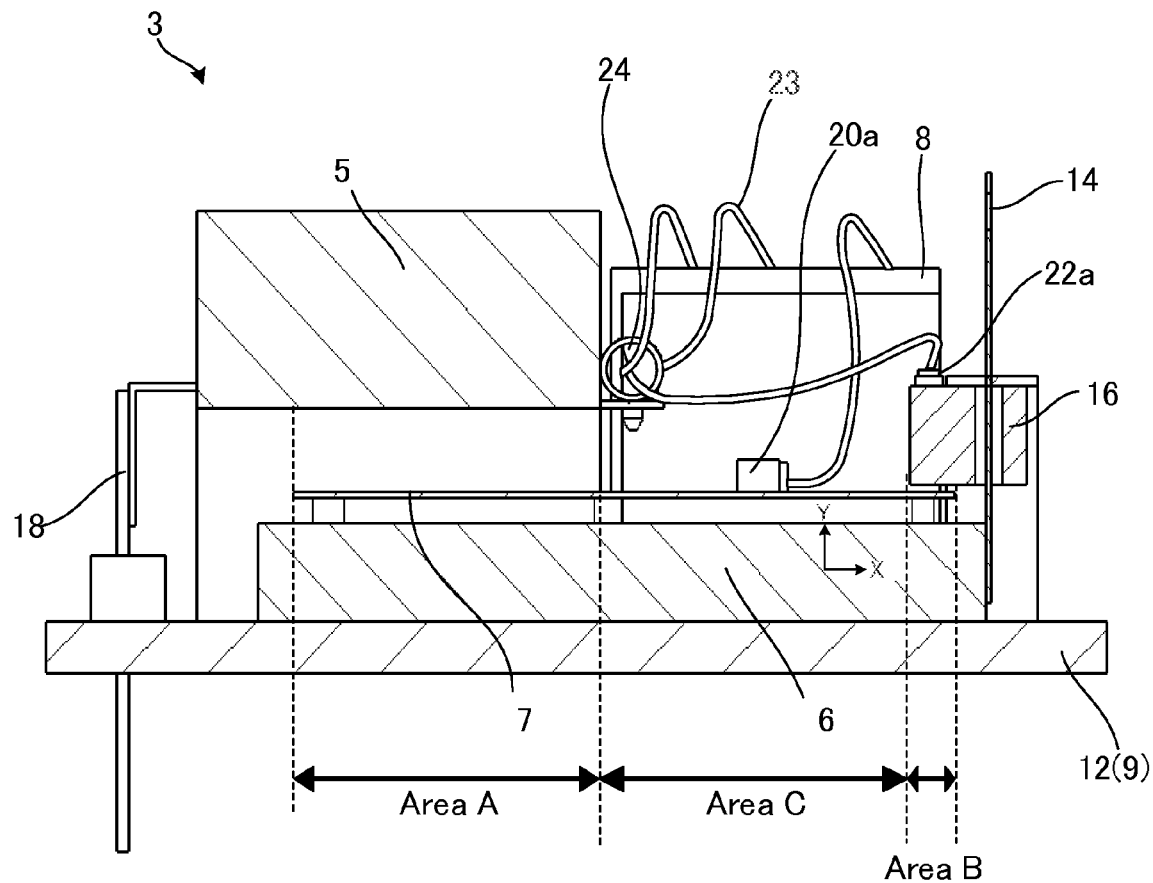
FIG. 5 is a cross-sectional view illustrating a power converter configured to be mounted on an electrically driven vehicle.
Figure 6:
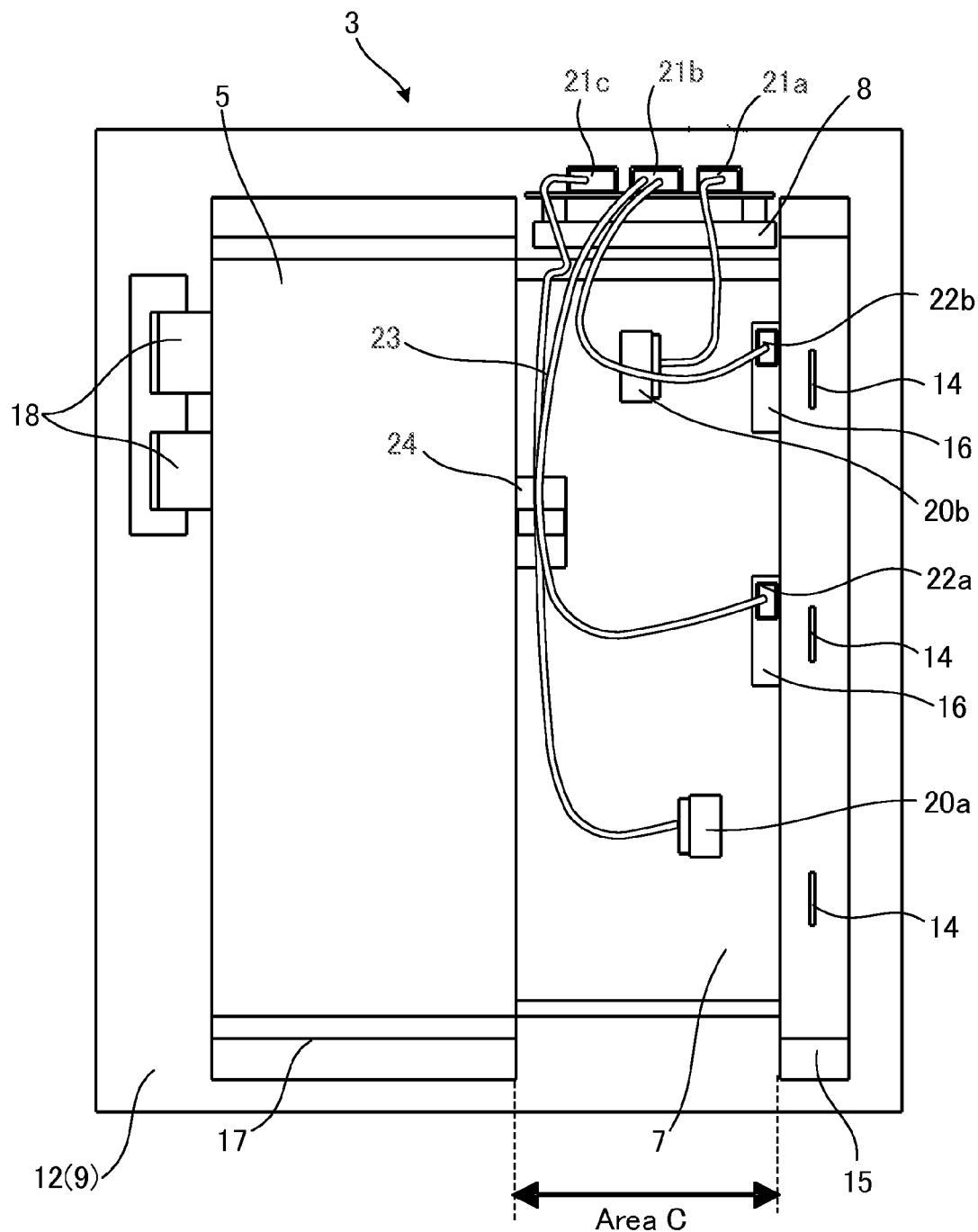
FIG. 6 is a plan view illustrating a power converter configured to be mounted on an electrically driven vehicle.

FIGS. 3 to 6 are diagrams illustrating the power converter 3 in detail, in which FIG. 3 is a perspective view, FIG. 4 is a perspective view as seen from a different direction, FIG. 5 is a cross-sectional view, and FIG. 6 is a plan view. FIGS. 3 to 6 show an assembly state in which the power converter 3 is flipped upside down from the installation state to the motor/generator 2.

Specifically, a bottom plate 12 of the cooler 9 is arranged to face upward in the lowermost side. The power module (inverter) 6 is abuttingly fixed on top of the bottom plate 12, and the control board 7 is abuttingly fixed on top of the power module 6. An upwardly extending middle busbar 13 connected to the smoothing capacitor 5 is provided in one end of the power terminal 6. An upwardly extending output busbar 14 for connection to the motor/generator 2 is provided in the other end of the power module 6.

The output busbar 14 extends to recede from the bottom surface of the cooler 9 (in a vertical direction) and has an intermediate portion supported by a bracket 15 fixed to the bottom surface of the cooler 9 by interposing an insulation material (not illustrated) and a leading end serving as a connection terminal to the motor/generator 2. A current sensor 16 supported by the bracket 15 is arranged in the intermediate portion of the output busbar 14. That is, the power module 6 has the middle busbar 13 in one side and the output busbar 14 in the other side while the control board 7 is stacked thereon. Similarly, the control board 7 is also arranged in an area interposed between the middle busbar 13 and the output busbar 14.

The smoothing capacitor 5 is arranged over the control board 7 with a gap from the control board 7. The smoothing capacitor 5 is supported by the bracket 17 fixed to the bottom plate 12 of the cooler 9 across the power module 6 and the control board 7. The upper end of the middle busbar 13 is connected to one end of the smoothing capacitor 5. The one end of the smoothing capacitor 5 is provided with an input busbar 18 connected to the battery (refer to FIG. 5). The input busbar 18 is arranged in a vertical direction in the drawings. The leading end of the input busbar 18 serves as a connection terminal to the battery while it penetrates through the bottom plate 12 of the cooler 9 in an insulation state.

The control board 7 includes an area A covered by the overlying smoothing capacitor 5 as a strong electric component, an area B covered by the current sensor 16 and the output busbar 14 as a strong electric component, and an area C not covered by the strong electric components (such as the smoothing capacitor 5, the output busbar 14, and the current sensor 16). The area C of the control board 7 is positioned in the side where the output busbar 14 is provided. In the area C, weak current connectors 20a and 20b connected to the motor control board 8 are arranged using a weak current harness 23.

The motor control board 8 is fixedly arranged in lateral portions of the power module 6, the output busbar 14, and the smoothing capacitor 5 in a direction perpendicular to the bottom plate 12 of the cooler 9 using a bracket (not illustrated). The motor control board 8 is arranged in a lateral side of the area C not covered by the smoothing capacitor 5 of the control board 7, that is, to close a space interposed between the smoothing capacitor 5 and the output busbar 14 in a horizontal direction. That is, the motor control board 8 is arranged in a direction perpendicular to the control board 7.

Connector provided in the other end of the weak current harness 23 connected to the weak current connectors 20a and 20b provided in the control board 7 and the weak current connectors 22a and 22b provided in the current sensor 16 are connected to each of the weak current connectors 21a, 21b, and 21c provided in the motor control board 8. Out of the weak current harnesses 23, the relatively long weak current harness 23 connected to the weak current connectors 20a and 22a distant from the motor control board 8 is supported in its intermediate portion by a resin clamp 24 provided in the other end of the smoothing capacitor 5 so as to resist to external vibration.

A wiring work for each weak current harness 23 is performed after each component of the power converter 3 such as the power module 6, the control board 7, the smoothing capacitor 5, and the motor control board 8 and other components such as the input/output busbar 14, the middle busbar 13, and the current sensor 16 are installed and assembled in the cooler 9. After each component is installed and assembled, a space over the area C not covered by the smoothing capacitor 5 of the control board 7 is surrounded by the smoothing capacitor 5, the output busbar 14, the current sensor 16, and the motor control board 8 and is opened upward.

Therefore, it is possible to successively perform a work for installing the harness 23 to connect the weak current connectors 21a, 21b, and 21c provided in the motor control board 8 to the connectors 20a and 20b and the current sensor 16 on the control board 7 using the weak current harness 23. Therefore, it is possible to provide excellent wiring workability. In addition, since the resin clamp 24 is provided on the other end face of the smoothing capacitor 5 facing this space, it is possible to efficiently perform a wiring work inside this space while the weak current harness 23 is supported by the resin clamp 24. Since the harness 23 is not routed outward in the horizontal direction of the control board 7 unlike the prior art, it is possible to suppress an increase of the size of the power converter 3 for the harness routing.

The output busbar 14 connected to the power module 6 is arranged perpendicularly to an arrangement plane of the control board 7 outside the area C broader than a projection plane of the smoothing capacitor 5 to the control board 7 in a horizontal direction. For this reason, it is possible to obtain a space for connecting each weak current harness 23 over the area C broader than the projection plane of the smoothing capacitor 5 to the control board 7 without interfering with the busbar 14 and further improve the harness connection workability. In addition, since the output busbar 14 is arranged in a vertical direction perpendicular to the control board 7, it is possible to suppress an increase of the size of the power converter 3 in a horizontal direction and reduce a size of the power converter 3, compared to a case where the output busbar 14 from the power module 6 is arranged to extend in a horizontal direction in parallel with the control board 7. Furthermore, similar to the output busbar 14, since the motor control board 8 is also arranged in a vertical direction perpendicular to the control board 7, it is possible to suppress an increase of the size of the power converter 3 in a horizontal direction and reduce a size of the power converter 3.

In the apparatus of the prior art, the weak current connector 20 is arranged in the control board 7 covered by the smoothing capacitor 5 entirely. Since the gap between the smoothing capacitor 5 and the control board 7 is narrow, workability for connection between the connector and the external connection harness is degraded disadvantageously. In order to address such a problem, it is necessary to provide an area not covered by the smoothing capacitor 5 on the control board 7 and arrange the weak current connector 20 in this area. For this reason, for example, the weak current connector 20 may be arranged in the area not covered by the smoothing capacitor 5 by reducing the length or width of the smoothing capacitor 5 itself, compared to the length or width of the control board 7. Alternatively, the weak current connector 20 may be arranged in the area not covered by the smoothing capacitor 5 by increasing the length or width of the control board 7, compared to the length or width of the smoothing capacitor 5. In the former case, it is difficult to sufficiently suppress a ripple of DC power and obtain necessary function of the smoothing capacitor 5. In the latter case, since a capacity of the smoothing capacitor 5 is obtained, it is possible to sufficiently suppress a ripple of DC power and obtain necessary function of the smoothing capacitor 5. However, since the surface area of the control board 7 increases, a size of power converter 3 including the housing 4 for housing the control board 7 increases.

According to this embodiment, the smoothing capacitor 5 has a sufficiently large volume to obtain a capacity sufficient to suppress a ripple of DC power. In order to provide a sufficiently large capacity of the smoothing capacitor 5, for example, a plurality of electrolytic capacitors connected in parallel with each other may be employed. In addition, in order to obtain a sufficiently large volume of the smoothing capacitor 5, a size of the width direction or the longitudinal direction is reduced while a size of the thickness direction is increased. Alternatively, the smoothing capacitor 5 itself may be housed in a metal casing. It is noted that, although the smoothing capacitor 5 has a rectangular shape in the illustrated example, the shape of the smoothing capacitor 5 is not particularly limited to the rectangle. Instead, the smoothing capacitor 5 may have a cylindrical shape having a sufficient volume.

The smoothing capacitor 5 obtained by increasing a size of the thickness direction is positioned in the uppermost side of the power converter 3 during the assembly work, and a part thereof is embedded in the area having a convex shape 11 in the housing 4. Accordingly, the smoothing capacitor 5 can be configured to cover a part of the control board 7 without covering the entire surface of the control board 7. As a result, it is possible to form the area C not covered by the smoothing capacitor 5 on the control board 7 regardless of a sufficiently larger capacity of the smoothing capacitor 5 and arrange the weak current connectors 20a and 20b in this area C. In addition, the surrounding space of the weak current connectors 20a and 20b is opened. As a result, it is possible to improve workability for connecting the connectors.

According to this embodiment, it is possible to obtain the following effects.

(A) The power converter 3 mounted on the electrically driven vehicle comprises the control board 7 that controls the power module 6 including a semiconductor device, connectors 20a and 20b provided on the control board 7 and connected to an external controller, the smoothing capacitor 5 as a strong electric component arranged so as to overlap the control board 7, and the housing 4 that houses the control board 7 and the strong electric components therein. The bottom portion of the housing 4 is formed in a convex shape 11, and a part of the smoothing capacitor 5 as a strong electric component is housed in an area of the convex shape 11 of the housing 4, so that a projection area to the control board 7 overlappingly arranged is formed to be smaller than the surface area of the control board 7. In the control board 7, the connectors 20a and 20b are arranged in the area C broader than the projection plane of the overlappingly arranged strong electric component to the control board 7. That is, since a part of the smoothing capacitor 5 as a strong electric component is housed in the area of the housing 4 swelling in the convex shape 11, it is possible to move a part of the volume of the smoothing capacitor 5 overlapping with the control board 7 to the area of the convex shape 11 of the housing 4. For this reason, the control board 7 can occupy the area C broader than the projection plane of the smoothing capacitor 5 as a strong electric component, and the connectors 20a and 20b can be arranged in this broad area C. Therefore, since the broad area C of the control board 7 is not covered by the smoothing capacitor 5 as a strong electric component but is opened, it is possible to improve workability for connecting the connectors.

(B) At least one of the harness 23 connected to the connectors 20a and 20b, the resin clamp 24 as a support member for supporting the harness 23, and the connectors 21a, 21b, and 21c in the other end of the harness 23 are arranged in the area C broader than the projection plane of the strong electric component to the control board 7. For this reason, it is possible to perform a work for installing the harness 23 to the connectors 20a and 20b on the control board 7 after the control board 7 or the component such as a strong electric component is installed and assembled. Therefore, it is possible to provide excellent wiring workability. Since the harness 23 is not routed outward in the horizontal direction of the control board 7 unlike the prior art, it is possible to suppress an increase of the size of the power converter 3 for the harness routing.

(C) The output busbar 14 connected to the power module 6 is arranged outside the area C broader than the projection plane of the strong electric component to the control board 7 in a horizontal direction. For this reason, it is possible to obtain a space for connecting the connectors 20a and 20b and the harness 23 on the control board 7 over the area C broader than the projection plane of the strong electric component to the control board 7 and further improve workability for connecting the harness.

(D) The output busbar 14 connected to the power module 6 is arranged perpendicularly to the arrangement plane of the control board 7. That is compared to a case where the output busbar 14 from the power module 6 is arranged to extend horizontally in parallel with the control board 7, the output busbar 14 is arranged in a vertical direction perpendicularly to the control board 7. Therefore, it is possible to suppress an increase of the size of the power converter 3 in the horizontal direction and reduce a size of the power converter 3.

(E) The electrically driven vehicle has the motor/generator 2 for driving a vehicle. The upper surface of the motor/generator 2 has the concave portion 33 which protrudes in both ends and is hollowed in the center. A swelling portion having the convex shape 11 in the housing 4 of the power converter 3 is housed in the concave portion 33 of the upper surface of the motor/generator 2, and the power converter 3 is fixed to the upper portion of the motor/generator 2. That is, the motor/generator 2 and the power converter 3 are integrated by combining concave and convex portions with each other. While the power converter 3 has the housing 4 swelling in the convex shape 11, the swelling area is housed in the concave portion 33 of the motor/generator 2. Therefore, it is possible to reduce a height of the power converter 3.

This invention is not limited to the aforementioned embodiments, various modifications or applications may be possible without departing from the spirit and scope of this invention.

This application is based on and claims priority to Japanese Patent Application Laid-open No. 2012-205895 (filed in Japan Patent Office on Sep. 19, 2012), the entire content of which is incorporated herein by reference.

The invention claimed is:

1. A power converter configured to be mounted on an electrically driven vehicle, comprising:
   a control board that controls a power module including a semiconductor device;
   a connector provided on the control board so as to be connected to an external controller;
   a first strong electric component and a second strong electric component arranged so as to overlap the control board;
   a motor control board arranged at a side of a space between the first and the second strong electric components in a direction perpendicular to the control board; and
   a housing that houses the control board, the motor control board, and the first and second strong electric component therein,
   wherein a bottom portion of the housing is formed to swell in a convex-shaped manner,
   wherein a part of the first strong electric component is housed in an area of the housing that swells in the convex-shaped manner, and the first strong electric component is formed so that a projection area thereof to the control board is smaller than a surface area of the control board,
   wherein the connector is arranged in an area of the control board other than a projection plane of the first strong electric component to the control board,
   wherein the second strong electric component is arranged in a side opposite to the first strong electric component with the area other than the projection plane of the first strong electric component to the control board therebetween, and
   wherein the connector is arranged in an area on the control board surrounded by the first and second strong electric components and the motor control board of the area other than the projection plane of the first strong electric component to the control board.

2. The power converter according to claim 1,
   wherein at least one of a harness connected to the connector, a support member that supports the harness, and a connector in the other end of the harness is arranged in an area of the control board other than the projection plane of the first strong electric component to the control board.

3. The power converter according to claim 1,
   wherein a busbar is included in the second strong electric component,
   wherein the busbar is connected to the power module, and
   wherein the busbar is arranged in a direction perpendicular to an arrangement surface of the control board.

4. The power converter according to claim 1,
   wherein the electrically driven vehicle has a motor/generator for driving the vehicle, and
   wherein a concave portion configured to protrude in both ends thereof and is hollowed in a center thereof, and the concave portion is formed on an upper surface of the motor/generator,
   wherein a portion swelling in the convex-shaped manner in the housing of the power converter is housed in the concave portion of the upper surface of the motor/generator so that the power converter is fixed to an upper portion of the motor/generator.

* * * * *